United States Patent

Welborn et al.

[11] Patent Number: 5,963,716
[45] Date of Patent: Oct. 5, 1999

[54] BI-DIRECTIONAL DATA STREAM DECOMPRESSION

[75] Inventors: Patrick E Welborn, Lake Oswego, Oreg.; David Hall, Vancouver, Wash.

[73] Assignee: Hewlett-Packard Company, Palo Alto, Calif.

[21] Appl. No.: 08/758,984

[22] Filed: Dec. 2, 1996

[51] Int. Cl.⁶ .................................................. G06K 15/02
[52] U.S. Cl. .......................................... 395/114; 395/115
[58] Field of Search ..................................... 395/114, 898, 395/115; 382/233, 244, 245, 246; 358/426, 444, 261.1, 427, 296

[56] References Cited

U.S. PATENT DOCUMENTS

| | | | |
|---|---|---|---|
| 4,463,444 | 7/1984 | Daniels et al. | 400/323 |
| 5,265,259 | 11/1993 | Satou et al. | 395/800 |
| 5,555,321 | 9/1996 | Ogura et al. | 382/236 |
| 5,649,189 | 7/1997 | Cook | 395/898 |

FOREIGN PATENT DOCUMENTS

540350A2 10/1992 European Pat. Off. .
WO95/23457A1 9/1995 WIPO .

*Primary Examiner*—Scott Rogers

[57] ABSTRACT

Described herein is a method of decompressing a compressed data stream from a data buffer. The compressed data stream is of a type having a plurality of compressed segments in a normal sequence, wherein each segment has a control element that specifies the length or number of following data elements. The method includes a step of reading the segments in their normal sequence from the data buffer. After reading a particular segment, its control element and data elements are reversed in order, and then rewritten to the data buffer in the original location of the segment. After reading and re-writing a plurality of the segments, the direction of reading can be reversed. That is, the segments can be read in reverse sequence. Because of the re-writing step, however, control elements will be read before data elements, thus enabling decompression even in the reverse direction.

18 Claims, 7 Drawing Sheets

BI-DIRECTIONAL DATA STREAM DECOMPRESSION

TECHNICAL FIELD

This invention relates to means and methods for bi-directionally decompressing data from a uni-directionally compressed data stream.

BACKGROUND OF THE INVENTION

Compressed data is often read or received as a continuous stream, with discrete segments that must be decompressed as they are read. Under many compression schemes, the segments have variable lengths. Each segment begins with a control word indicating the length of the segment or the number of data bytes or elements that follow the control word.

FIG. 1 shows an example of a data stream 10 having multiple discrete segments 11, referred to as segments A through N. Each segment has a control word or element 12, followed by a variable number of data elements 13. In the example, the control elements are labeled "CONTROL A" through "CONTROL N". The data elements are similarly labeled to correspond to their control elements. For example, the data elements corresponding to control element CONTROL A are labeled "DATA A1" through "DATA A2".

Each control word contains a value indicating, among other things, the number and/or length of the following data elements within the segment. The next control word is located after the indicated number of data elements.

There are various different types of compression schemes that utilize control elements followed by a variable number of data elements. Two specific examples are found in U.S. Pat. Nos. 5,060,286 and 5,452,405, which are hereby incorporated by reference. Note that the control elements might indicate various things about the following data elements in addition to their length, such as for example an offset relative to previous data values.

One characteristic of compressed data streams as shown in FIG. 1 is that they must be read in their normal, forward order, in which control elements precede data elements. Reading the data stream in reverse order is impossible. Suppose, for example, that reading was to begin at the end of data stream 10, at the data element labeled DATA N2. The problem with this is that there would be no way to know the number of data elements preceding the control element labeled 15. Thus, it would be impossible to locate the control element or to differentiate it from data elements.

In spite of the difficulties, it is sometimes required to consume a compressed data stream in reverse order. Bi-directional raster-type printers illustrate the need for such reverse consumption. In printers such as this, multiple printhead passes over a single raster row are often required. The data corresponding to the raster row is needed first in its original order for a first pass of the printhead in a forward direction, and then in reverse order for a second pass of the printhead in a reverse direction.

There are two primary solutions to this problem. The first solution is to modify the compression scheme by placing a similar control element both before and after the data elements of a particular segment. The disadvantage of this solution is that it doubles the number of required control words, thereby reducing the efficiency of the compression scheme.

The second primary solution is to create and hold a copy of the decompressed data during a first, forward decompression of the data stream, and subsequently refer to the decompressed data rather than to the original compressed data stream. The disadvantage of this solution is that it requires significant amounts of memory to store the decompressed data.

The inventors have developed a way to consume compressed data bi-directionally, without decreasing compression efficiency, and without requiring added memory.

SUMMARY OF THE INVENTION

The invention includes a method of decompressing a compressed data stream having discrete compressed segments that occur in a normal sequence having control elements preceding data elements. Initially, the data stream is consumed in its normal sequence from a data buffer. After reading each segment, however, the positions of the control elements and data elements are reversed within the data buffer. That is, each segment is modified after it is consumed in the forward direction, so that its data elements precede the associated control element. Subsequently, when reading in reverse order from the data buffer, control elements will be read before the associated data elements, thereby enabling decompression of the data buffer.

DETAILED DESCRIPTION

Figure 1:
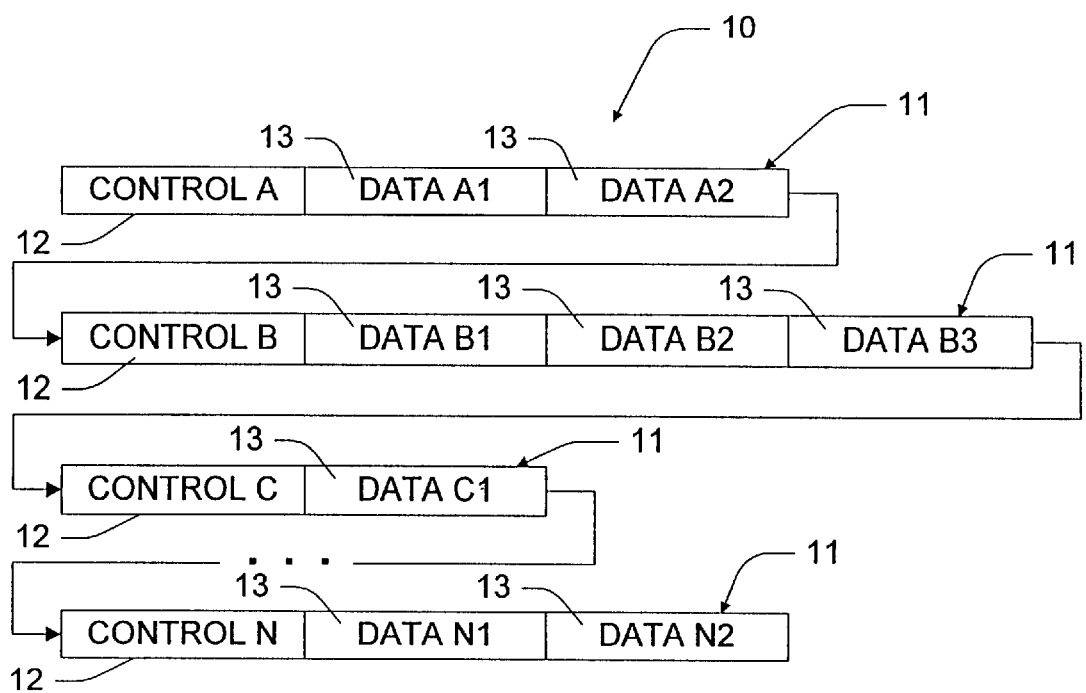
FIG. 1 is a block diagram of a data buffer holding uni-directionally compressed data in accordance with the prior art.
Figure 2:
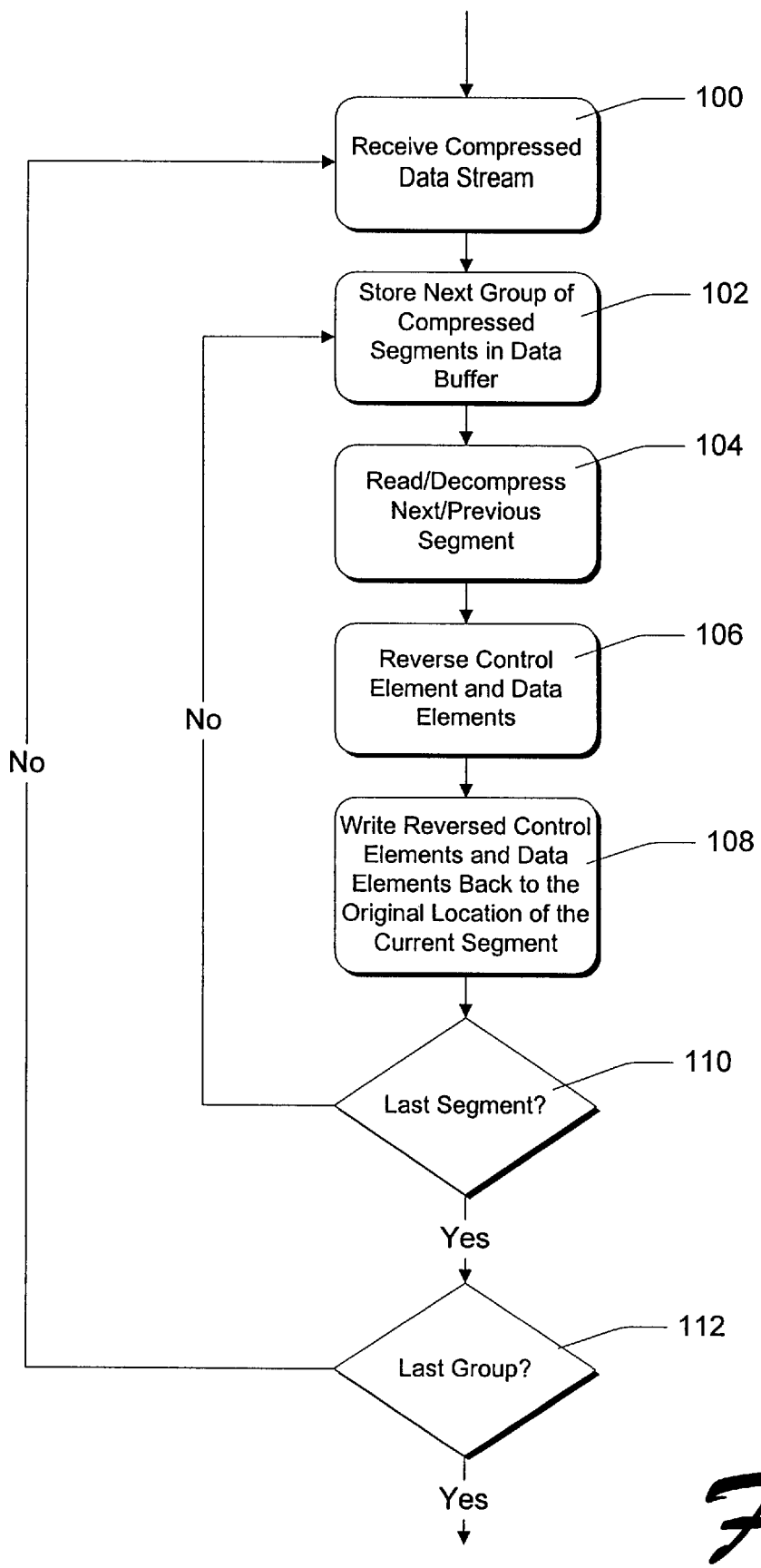
FIG. 2 is a flowchart showing a method in accordance with the invention.

FIG. 2 shows preferred steps in accordance with one embodiment of the invention. These steps are implemented by a programmable computer or microprocessor such as might be found in the controller of a printer, or by equivalent hard-wired logic.

A first step 100 comprises receiving a compressed data stream. The compressed data stream has a plurality of compressed segments in a normal sequence. Each segment has a control element followed by associated data elements. In most cases, the control element specifies the length of the following data elements.

A subsequent step 102 comprises storing a group of compressed segments in a data buffer, in the same order in which they were received. Each group corresponds to some logical number of segments which must be handled as a whole. In a printer, for instance, a group of segments might include the segments holding data for a particular printed row, or perhaps the segments holding data needed for the multiple rows of a printhead pass.

FIGS. 3–7 illustrate a data buffer 30 having compressed data segments 31 with control elements 32 and following data elements 33. In the preferred embodiment of the invention, the data buffer is traversed bi-directionally, starting at its beginning. Compressed data is read element-by-element. A current buffer pointer, indicated by reference numeral 34, indicates the current progress of reading the data buffer. When reading either in the forward or reverse direction, pointer 34 is maintained so that it references the next element to be read. Specifically, when traversing the data buffer in the forward direction, the current buffer pointer is advanced in the forward direction after reading each element. When traversing the data buffer in the reverse direction, the current buffer pointer is advanced in the reverse direction after reading each element.

Figure 3:
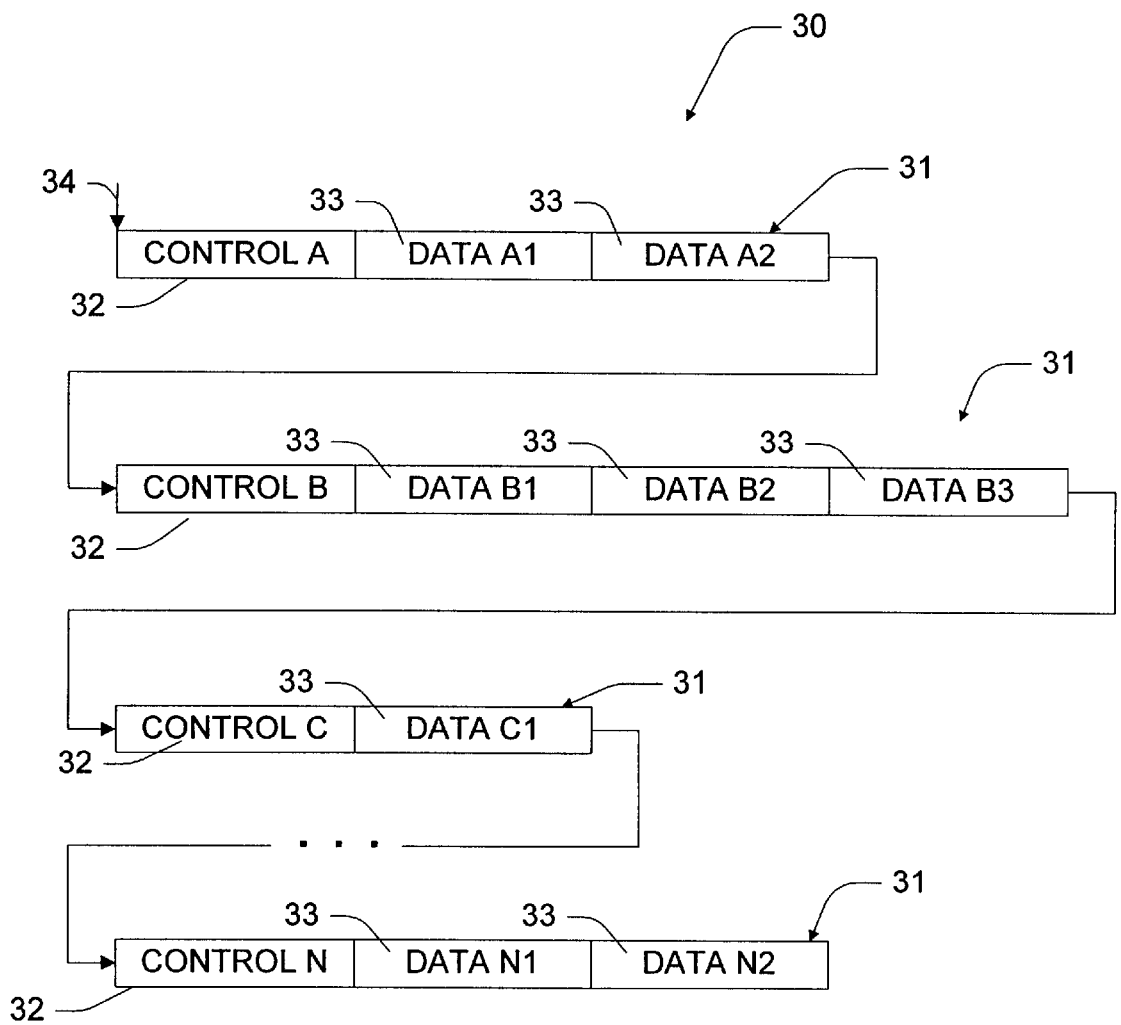
FIGS. 3–7 are block diagrams showing an example data buffer at different points in the method of FIG. 2.

In FIG. 3, current data pointer 34 is at the beginning of the data buffer, indicating that a first element (CONTROL A) is the next element to be read in the forward direction. Reading in the reverse direction is not possible at this point, since the current data pointer is already at the beginning of the data buffer.

The segments are read and decompressed one-by-one in their normal, forward sequence from the data buffer. Referring again to FIG. 2, a step 104 comprises reading and decompressing a particular segment from the data buffer. During reading, the current buffer pointer is maintained so that it always indicates the location in the data buffer of the next element to be read. Thus, the current buffer pointer is advanced during forward traversal of the data buffer after reading every element.

Figure 4:
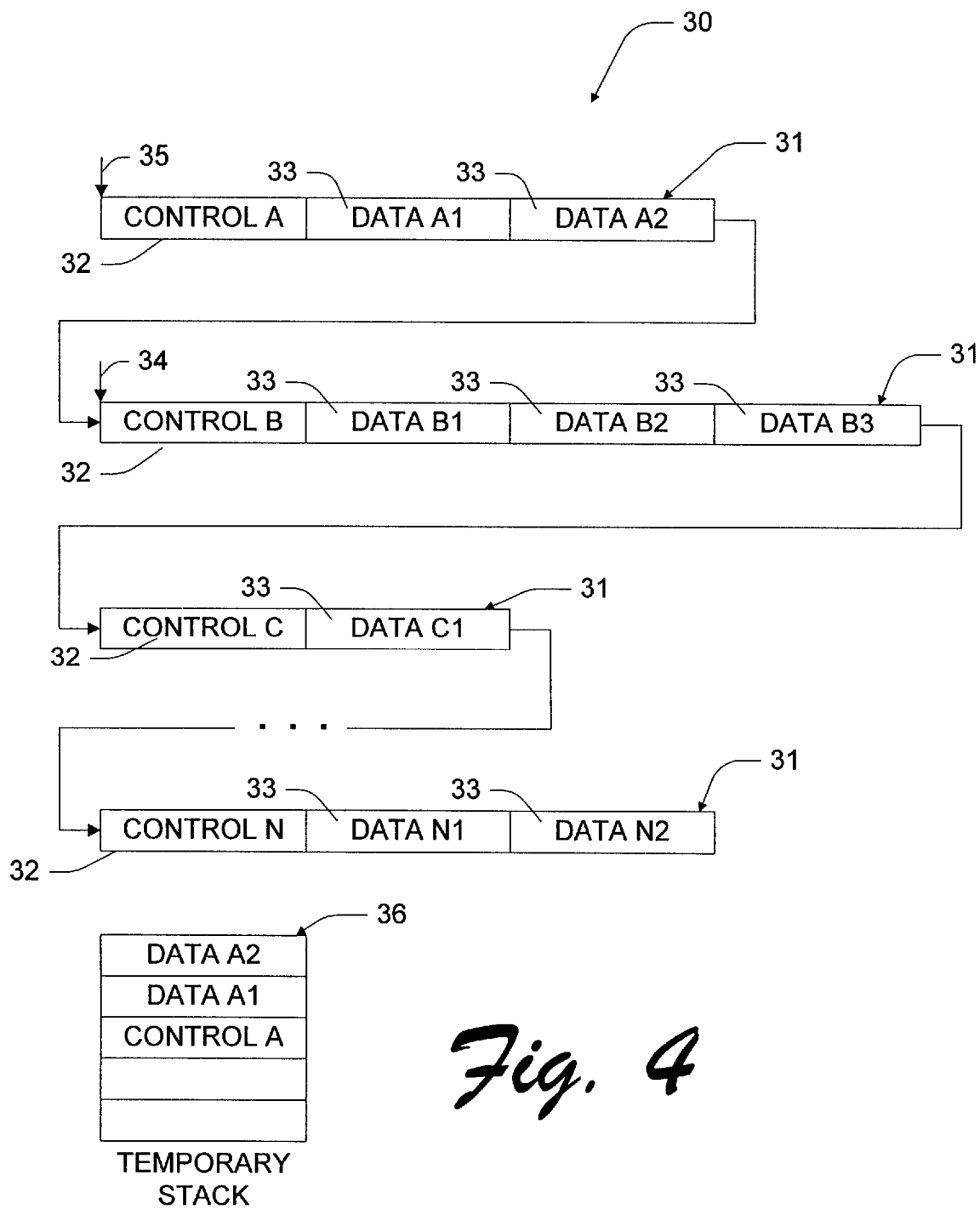

FIG. 4 shows the position of the current buffer pointer after reading the first compressed segment of data buffer 30—it is positioned before segment B, indicating that segment B is the next segment to be read in the forward direction.

Referring once more to FIG. 2, a step 106 is now performed of reversing the order of the control element and the associated data elements from the compressed segment that was just read from the data buffer. Step 108 is then performed of writing the compressed segment back to its original location in the data buffer, with the control element and the associated data elements reversed. That is, the control element is repositioned so that it follows the data elements and the data elements are reversed in order. In some cases, it might even be desirable to reverse the bit order of the data elements before writing them back to the data buffer.

In practice, steps 106 and 108 are performed by maintaining a lagging buffer pointer 35 and a temporary memory stack 36 (FIG. 4). Lagging buffer pointer 35 is used to record the original location of a segment within the data buffer. It is maintained so that it indicates the location of the next compressed segment whose control element and associated data elements are to be re-written to the data buffer. More specifically, the lagging data pointer is advanced segment-by-segment, in the forward direction, during traversal of the data buffer in the forward direction. However, it is advanced beyond a particular segment only after the writing step has been accomplished with regard to that segment. After such a writing step, the lagging data pointer is advanced to the next compressed segment—to the same position as the current buffer pointer.

Temporary memory stack 36 is used to store the elements read from the data buffer so that they can be rearranged and written back to the data buffer. As data elements are read from buffer 30, they are pushed onto temporary memory stack 36. Thus, control element A is written first, followed by data element A1 and then data element A2. This is the state shown in FIG. 4. Lagging buffer pointer 35 is shown positioned before the first compressed segment, while the current buffer pointer is positioned before the second compressed segment. This indicates that the entire segment A has been read, but has yet to be rewritten.

Figure 5:
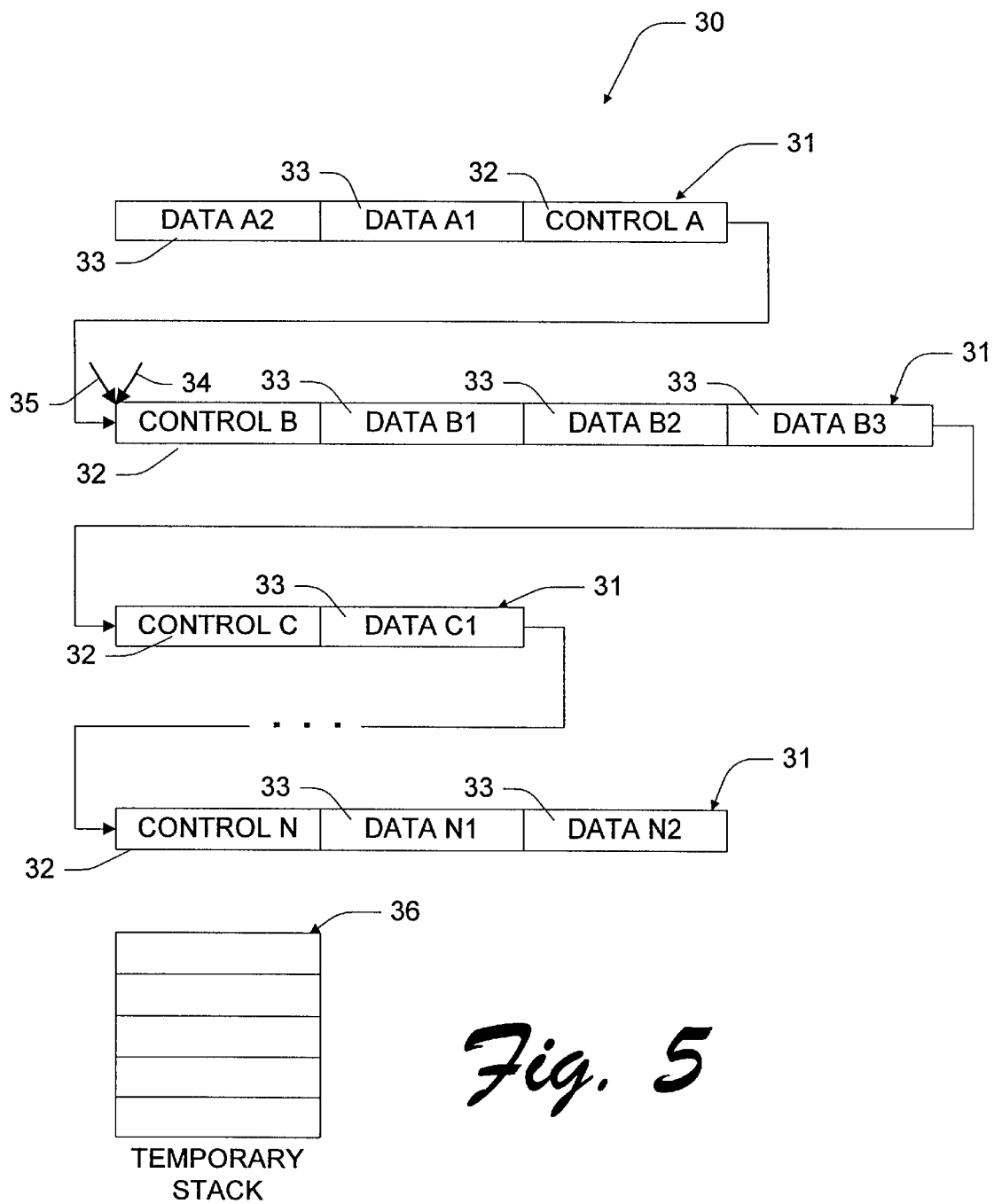

To rewrite the elements back to the data buffer, they are simply popped off the stack, in a last-in-first-out sequence, to sequential locations in the data buffer—starting at the location referenced by lagging data pointer 35. Thus, data element A2 is written first, followed by data element A1, and then followed by control element A. The lagging data pointer is then advanced to the next segment. The result is shown in FIG. 5.

Figure 6:
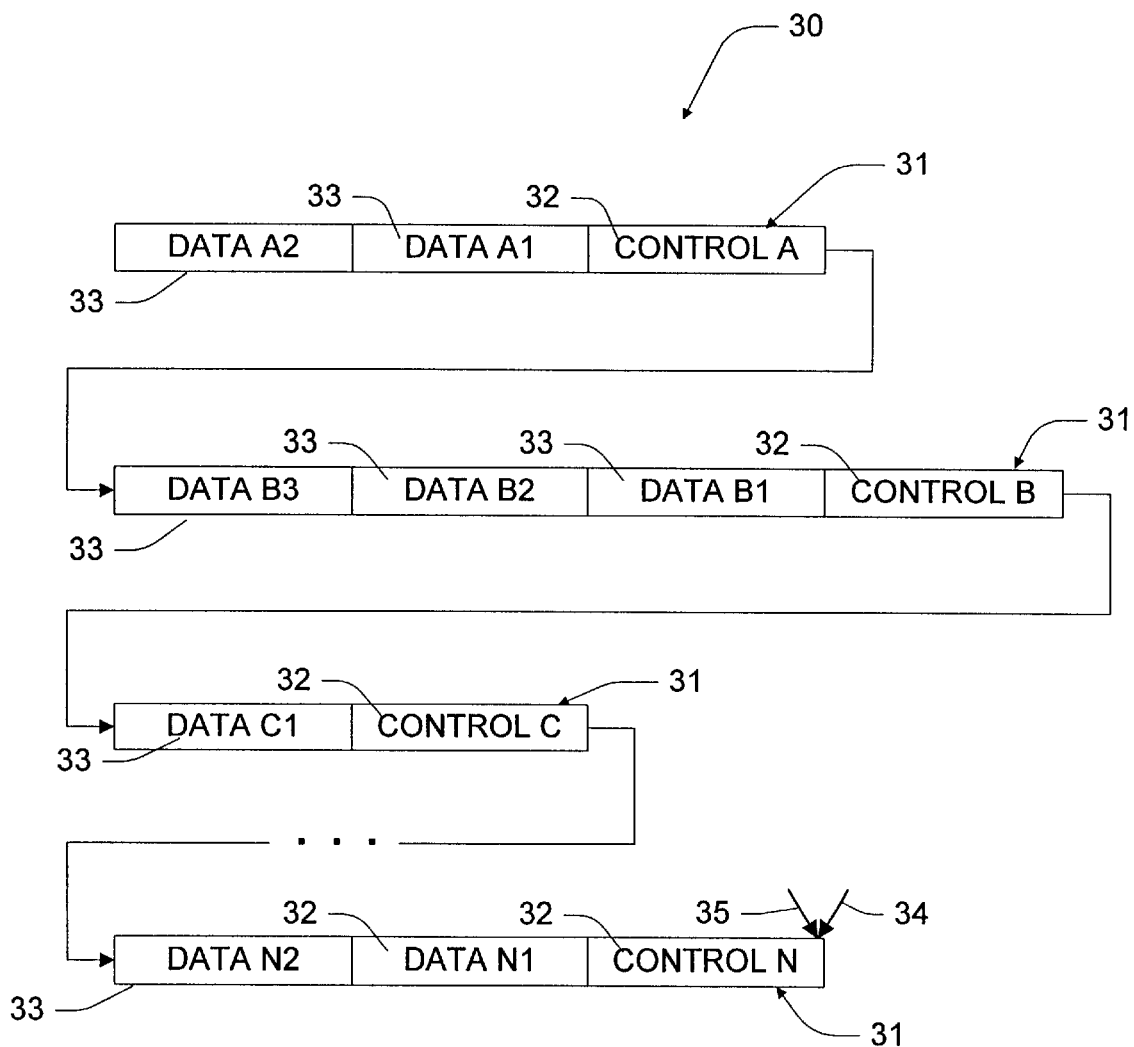

FIG. 6 shows the resulting content of data buffer 30 after traversing the entire data buffer in the forward direction. Steps 110 and 112 of FIG. 2 are decision steps indicating that the process is repeated for each segment and for subsequent groups of segments.

Using the scheme described above, it is possible after reading and rewriting a plurality of the segments in their normal order from the data buffer to reverse the direction of buffer traversal. The invention thus includes at step of reading segments in reverse sequence from the data buffer, starting at the last segment whose control element and associated data elements have been reversed. Such a reversal can only be initiated at a point in the process where the current buffer pointer and the lagging buffer pointer coincide. The reading process can be reversed multiple times, when it is required to consume data several times in different directions.

Figure 7:
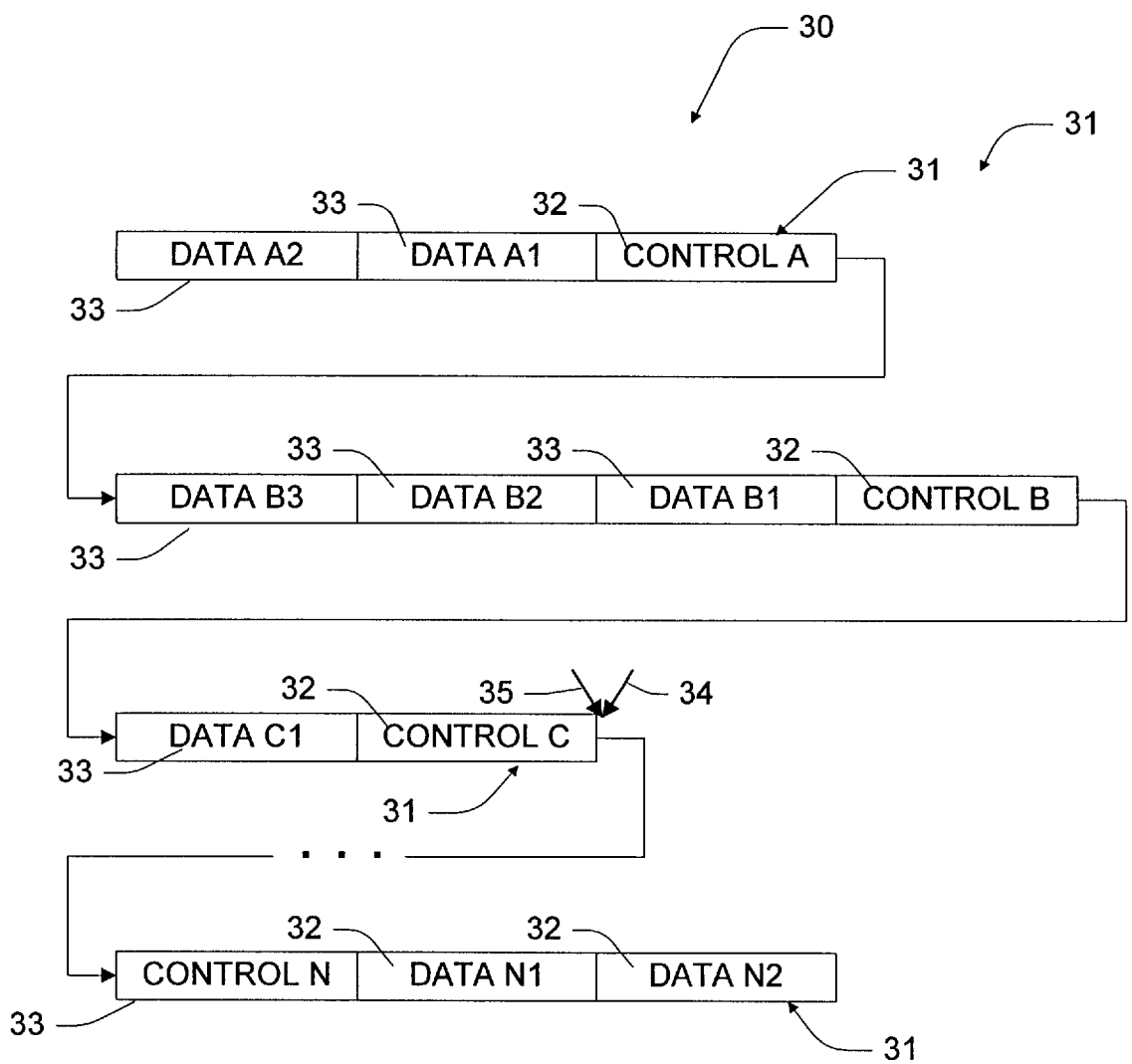

Reading the data buffer in the reverse direction is performed similarly to reading it in the forward direction. Specifically, the step of reversing the control and data elements continues even when reading the data buffer in the reverse direction. Data is read element-by-element, starting with a control element. The current buffer pointer is advanced in the reverse direction as each element is read. Elements are pushed onto the temporary memory stack as they are read, and popped back to the data buffer after reading an entire segment. The lagging data pointer is advanced in the reverse direction segment-by-segment, after each segment is rearranged and rewritten to the data buffer. FIG. 7 shows the resulting data buffer after compressed segment N has been read in the reverse direction. After a segment is read in the reverse direction, its elements are positioned as they were in the original data stream. From the point shown in FIG. 7, decompression can proceed in either the forward or reverse direction from the current buffer pointer, because a control element is positioned immediately preceding and immediately following the current buffer pointer.

The invention provides a needed improvement in decompression techniques, by allowing uni-directionally compressed data streams to be consumed bi-directionally without significant added overhead.

In compliance with the statute, the invention has been described in language more or less specific as to its preferred features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of processing a compressed data stream, the compressed data stream having a plurality of compressed segments in a normal order, each segment having a control element followed in the normal order of the data stream by associated data elements, the method comprising:

reading the segments in their normal order;

after reading a particular segment, reversing the order of the control element relative to the associated data elements of the particular segment so that the control element follows the data elements in the normal order of the data stream.

2. A method as recited in claim 1, further comprising an additional step of decompressing the segments after performing the reading step.

3. A method as recited in claim 1, the data elements having a bit order, the method further comprising an additional step of reversing the bit order of the data elements.

4. A method as recited in claim 1, further comprising the following additional step that is performed after reading a plurality of the segments in their normal order:

reading segments in reverse order, starting at the last segment whose control element and associated data elements have been reversed.

5. A method as recited in claim 1, further comprising the following additional steps that are performed after reading a plurality of the segments in their normal order:

reading segments in reverse order, starting at the last segment whose control element and associated data elements have been reversed;

continuing to perform the reversing step when reading the segments in reverse order.

6. A method as recited in claim 5, further comprising decompressing the segments.

7. A method of processing a compressed data stream from a data buffer, the compressed data stream having a plurality of compressed segments in a normal order in the data buffer, each segment having a control element followed in the normal order of the compressed data stream by associated data elements, the method comprising:

reading the segments in their normal order from the data buffer;

after reading particular segment from a location the data buffer, writing it back to its location in the data buffer with the control element reversed in order relative to the associated data elements.

8. A method as recited in claim 7, further comprising an additional step of decompressing the segments after reading them.

9. A method as recited in claim 7, further comprising an additional step of using a memory stack to temporarily store the control element and associated data elements of the particular segment before writing the control element and associated data elements back to the data buffer.

10. A method as recited in claim 7, further comprising the following additional steps:

maintaining a first buffer pointer indicating the location of the next element to be read from the data buffer;

maintaining a second buffer pointer indicating the location of the next compressed segment whose control element and associated data elements are to be written in reversed order.

11. A method as recited in claim 7, further comprising the following additional steps:

maintaining a first buffer pointer indicating the location of the next element to be read from the data buffer;

maintaining a second buffer pointer indicating the location of the next compressed segment whose control element and associated data elements are to be written in reversed order;

advancing the first buffer pointer after reading each element;

advancing the second buffer pointer after writing each compressed segment back to its same location.

12. A method as recited in claim 7, the data elements having a bit order, the method further comprising an additional step of reversing the bit order of the data elements before writing them back to the data buffer.

13. A method as recited in claim 7, further comprising an additional step of reading segments in reverse order from the data buffer, starting at the last segment whose control element and associated data elements have been written back to the data buffer.

14. A method of processing a compressed data stream from a data buffer, the compressed data stream having a plurality of compressed segments in a normal order in the data buffer, each segment having a control element followed in the normal order of the compressed data stream by associated data elements, the method comprising:

reading the segments in their normal order from the data buffer;

when reading a particular segment from the data buffer, recording its original location with a buffer pointer;

reversing the order of the control element relative to the data elements in said particular segment;

writing said particular segment back to its original location as indicated by the buffer pointer, with the control element reversed in order relative to the data elements.

15. A method as recited in claim 14, further comprising an additional step of decompressing the segments after reading them.

16. A method as recited in claim 14, further comprising an additional step of using a memory stack to temporarily store the control element and associated data elements of the particular segment before writing the control elements and associated data elements back to the data buffer.

17. A method as recited in claim 14, the data elements having a bit order, the method further comprising an additional step of reversing the bit order of the data elements before writing them back to the data buffer.

18. A method as recited in claim 14, further comprising an additional step of reading segments in reverse order from the data buffer, starting at the last segment whose control element and associated data elements have been written back to the data buffer.

* * * * *